US012796140B2

(12) United States Patent
Zhou et al.

(10) Patent No.: US 12,796,140 B2
(45) Date of Patent: Nov. 10, 2026

(54) MICRO LIGHT-EMITTING DIODE DISPLAY PANEL AND MICRO LIGHT-EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Weilong Zhou, Wuhan (CN); Liang Sun, Wuhan (CN); Sheng Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 375 days.

(21) Appl. No.: 18/523,959

(22) Filed: Nov. 30, 2023

(65) Prior Publication Data

US 2025/0126913 A1 Apr. 17, 2025

(30) Foreign Application Priority Data

Oct. 12, 2023 (CN) ........................ 202311322744.0

(51) Int. Cl.
*H10H 20/821* (2025.01)
*H10D 84/00* (2025.01)
(Continued)

(52) U.S. Cl.
CPC ......... *H10F 39/806* (2025.01); *H10D 84/221* (2025.01); *H10F 39/8023* (2025.01);
(Continued)

(58) Field of Classification Search
CPC . H10D 84/221; H10F 39/806; H10F 39/8023; H10H 20/821; H10H 20/8316;
(Continued)

(56) References Cited

U.S. PATENT DOCUMENTS 5,140,462 A 8/1992 Kitagishi
2004/0080938 A1 4/2004 Holman et al.
(Continued)

FOREIGN PATENT DOCUMENTS

CN 104303085 A 1/2015
CN 108267891 A 7/2018
(Continued)

OTHER PUBLICATIONS

International Search Report in International application No. PCT/CN2024/124237, mailed on Jan. 2, 2025.
(Continued)

*Primary Examiner* — Omar F Mojaddedi
(74) *Attorney, Agent, or Firm* — PV IP PC; Peter Stecher; Wei Te Chung

(57) ABSTRACT

A micro light-emitting diode display panel and a micro light-emitting diode display device. A prism layer is provided with a void, which surrounds a light-emitting chip and is arranged axially symmetrically with respect to a center line of the light-emitting chip. Therefore, a distance between the light-emitting chip and the void in a transverse direction is equal to a distance between the light-emitting chip and the void in an oblique direction, and an angle at which a light ray emitted from the light-emitting chip is reflected at a contact surface between the prism layer and the void in the transverse direction is same as an angle at which a light ray emitted from the light-emitting chip is reflected at the contact surface in the oblique direction. Accordingly, a plane
(Continued)

formed by the light-emitting chip and the contact surface is same as a tangential focal plane or a sagittal focal plane.

18 Claims, 8 Drawing Sheets

(51) Int. Cl.
*H10F 39/00* (2025.01)
*H10H 20/831* (2025.01)
*H10H 29/14* (2025.01)

(52) U.S. Cl.
CPC ...... *H10H 20/821* (2025.01); *H10H 20/8316* (2025.01); *H10H 29/142* (2025.01)

(58) Field of Classification Search
CPC ............. H10H 29/142; H10H 29/0363; H10H 29/0364; H10H 29/49; H10H 29/37; H10H 29/855; H10H 29/856; H10H 29/853; H10W 90/00
See application file for complete search history.

(56) References Cited

U.S. PATENT DOCUMENTS

| | | | | |
|---|---|---|---|---|
| 2005/0213983 | A1* | 9/2005 | Shie | H04B 10/40<br>398/135 |
| 2007/0058260 | A1 | 3/2007 | Steenblik et al. | |
| 2011/0019397 | A1* | 1/2011 | Wang | H10H 20/855<br>257/E33.059 |
| 2019/0080138 | A1* | 3/2019 | Gao | G02B 3/0031 |
| 2022/0068995 | A1* | 3/2022 | Xu | H10H 20/841 |
| 2022/0328729 | A1* | 10/2022 | Lunev | H10H 20/8506 |

FOREIGN PATENT DOCUMENTS

| | | | |
|---|---|---|---|
| CN | 110600508 | A | 12/2019 |
| CN | 112882281 | A | 6/2021 |
| CN | 113451475 | A | 9/2021 |
| CN | 115472730 | A | 12/2022 |
| CN | 218351063 | U | 1/2023 |
| JP | 2001250986 | A | 9/2001 |
| KR | 20140088744 | A | 7/2014 |

OTHER PUBLICATIONS

Written Opinion of the International Search Authority in International application No. PCT/CN2024/124237, mailed on Jan. 2, 2025.

Chinese Office Action issued in corresponding Chinese Patent Application No. 202311322744.0 dated Sep. 3, 2025, pp. 1-7.

* cited by examiner

MICRO LIGHT-EMITTING DIODE DISPLAY PANEL AND MICRO LIGHT-EMITTING DIODE DISPLAY DEVICE

CROSS REFERENCE TO RELATED APPLICATION

This application claims priority to Chinese Application No. 202311322744.0, filed on Oct. 12, 2023. The entire disclosure of the above application is incorporated herein by reference.

FIELD OF THE INVENTION

The present disclosure relates to a field of display technology, in particular to a micro light-emitting diode display panel and a micro light-emitting diode display device.

BACKGROUND

With development of augmented reality (AR) technology and virtual reality (VR) technology, micro display technology using silicon-based light-emitting diodes is the best solution to improve display effects. Specifically, a micro light-emitting diode display device comprises a light-emitting chip and a prism, and the prism is disposed on the light-emitting chip to control a light pattern of the light-emitting chip. However, in an actual display process, it is found that a spacing of subpixels arranged transversely is different from a spacing of the subpixels arranged obliquely, so that the prism has different shapes in a transverse direction and an oblique direction, and an inclined plane formed by the light-emitting chip and the prism is different from a tangential focal plane and a sagittal focal plane, resulting in third-order aberration. Therefore, astigmatism occurs during display and affects display effect, and crosstalk of transverse lights between the adjacent subpixels causes chromatic aberration, thereby affecting the display effect.

Accordingly, current silicon-based micro light-emitting diode display devices have a technical problem of poor display effect due to astigmatism caused by different shapes of prisms in different directions.

SUMMARY

Embodiments of the present disclosure provide a micro light-emitting diode display panel and a micro light-emitting diode display device to solve a technical problem of poor display effect due to astigmatism caused by different shapes of prisms in different directions in current silicon-based micro light-emitting diode display devices.

One embodiment of the present disclosure provides a micro light-emitting diode display panel. The micro light-emitting diode display panel comprises a substrate and a light-emitting layer. The light-emitting layer is disposed on a side of the substrate. The light-emitting layer comprises a light-emitting chip and a prism layer. The prism layer is disposed on a side of the light-emitting chip away from the substrate. The prism layer is provided with a void surrounding the light-emitting chip, and the void is arranged axially symmetrically with respect to a center line of the light-emitting chip.

Optionally, the light-emitting layer further comprises a common electrode layer, and the common electrode layer is disposed between the light-emitting chip and the prism layer. The prism layer comprises a plurality of protrusion portions and a plurality of connecting portions. Each of the connecting portions is located between the adjacent protrusion portions, and a distance between the connecting portions and the substrate is less than a distance between the protrusion portions and the substrate. The common electrode layer comprises a first horizontal portion corresponding to the protrusion portion, a second horizontal portion corresponding to the connecting portion, and a third horizontal portion located between the first horizontal portion and the second horizontal portion. In a direction from the substrate to the light-emitting layer, a distance between the first horizontal portion and a bottom surface of the light-emitting chip is greater than a distance between the third horizontal portion and the bottom surface of the light-emitting chip, a distance between the second horizontal portion and the bottom surface of the light-emitting chip is greater than the distance between the third horizontal portion and the bottom surface of the light-emitting chip, and the second horizontal portion is disposed on a side of the third horizontal portion away from the substrate.

Optionally, in the direction from the substrate to the light-emitting layer, the distance between the first horizontal portion and the bottom surface of the light-emitting chip is greater than the distance between the second horizontal portion and the bottom surface of the light-emitting chip, the void is arc-shaped, and the void is concave from an area between the light-emitting chips to the light-emitting chips.

Optionally, the void is arranged at a junction of the protrusion portion and the connecting portion, and the void is bent from the protruding portion toward the connecting portion.

Optionally, in the direction from the substrate to the light-emitting layer, the distance between the first horizontal portion and the bottom surface of the light-emitting chip is equal to the distance between the second horizontal portion and the bottom surface of the light-emitting chip, and the void is linear.

Optionally, in the direction from the substrate to the light-emitting layer, the distance between the first horizontal portion and the bottom surface of the light-emitting chip is less than the distance between the second horizontal portion and the bottom surface of the light-emitting chip, the void is arc-shaped, and the void is concave from the light-emitting chips to an area between the light-emitting chips.

Optionally, the light-emitting layer further comprises an independent electrode layer, and the independent electrode layer is disposed on a side of the light-emitting chip away from the common electrode layer.

Optionally, a plurality of the light-emitting chips are arranged in an array in a first direction and a second direction. The micro light-emitting diode display panel further comprises a third direction. The third direction and the first direction form a first angle, the third direction and the second direction form a second angle, the first angle and the second angle are acute angles, and the common electrode layer covers the light-emitting chips and is disposed between the adjacent light-emitting chips. A width of the third horizontal portion of the common electrode layer in the first direction is equal to a width of the third horizontal portion of the common electrode layer in the third direction.

Optionally, a plurality of the light-emitting chips are arranged in an array in a first direction and a second direction. The common electrode layer covers the light-emitting chips and is disposed between the adjacent light-emitting chips. The second horizontal portion comprises a first sub-portion extends along the first direction and a second sub-portion extends along a third direction, where the third direction and the first direction form a first angle, the third direction and the second direction form a second angle, the first angle and the second angle are acute angles. A difference between a width of the second sub-portion and a width of the first sub-portion is equal to a difference between a distance between the adjacent protrusion portions in the third direction and a distance between the adjacent protrusion portions in the first direction.

Optionally, there is a distance between the void and an upper surface of the prism layer, and there is a distance between the void and an upper surface of the common electrode layer.

Optionally, a refractive index of the prism layer 235 ranges between 1.4 and 2.5.

Another embodiment of the present disclosure provides a micro light-emitting diode display device that includes a micro light-emitting diode display panel. The micro light-emitting diode display panel comprises a substrate and a light-emitting layer. The light-emitting layer is disposed on a side of the substrate. The light-emitting layer comprises a light-emitting chip and a prism layer. The prism layer is disposed on a side of the light-emitting chip away from the substrate. The prism layer is provided with a void surrounding the light-emitting chip, and the void is arranged axially symmetrically with respect to a center line of the light-emitting chip.

Optionally, the light-emitting layer further comprises a common electrode layer, and the common electrode layer is disposed between the light-emitting chip and the prism layer. The prism layer comprises a plurality of protrusion portions and a plurality of connecting portions. Each of the connecting portions is located between the adjacent protrusion portions, and a distance between the connecting portions and the substrate is less than a distance between the protrusion portions and the substrate. The common electrode layer comprises a first horizontal portion corresponding to the protrusion portion, a second horizontal portion corresponding to the connecting portion, and a third horizontal portion located between the first horizontal portion and the second horizontal portion. In a direction from the substrate to the light-emitting layer, a distance between the first horizontal portion and a bottom surface of the light-emitting chip is greater than a distance between the third horizontal portion and the bottom surface of the light-emitting chip, a distance between the second horizontal portion and the bottom surface of the light-emitting chip is greater than the distance between the third horizontal portion and the bottom surface of the light-emitting chip, and the second horizontal portion is disposed on a side of the third horizontal portion away from the substrate.

Optionally, in the direction from the substrate to the light-emitting layer, the distance between the first horizontal portion and the bottom surface of the light-emitting chip is greater than the distance between the second horizontal portion and the bottom surface of the light-emitting chip, the void is arc-shaped, and the void is concave from an area between the light-emitting chips to the light-emitting chips.

Optionally, the void is arranged at a junction of the protrusion portion and the connecting portion, and the void is bent from the protruding portion toward the connecting portion.

Optionally, in the direction from the substrate to the light-emitting layer, the distance between the first horizontal portion and the bottom surface of the light-emitting chip is equal to the distance between the second horizontal portion and the bottom surface of the light-emitting chip, and the void is linear.

Optionally, in the direction from the substrate to the light-emitting layer, the distance between the first horizontal portion and the bottom surface of the light-emitting chip is less than the distance between the second horizontal portion and the bottom surface of the light-emitting chip, the void is arc-shaped, and the void is concave from the light-emitting chips to an area between the light-emitting chips.

Optionally, the light-emitting layer further comprises an independent electrode layer, and the independent electrode layer is disposed on a side of the light-emitting chip away from the common electrode layer.

Optionally, a plurality of the light-emitting chips are arranged in an array in a first direction and a second direction. The micro light-emitting diode display panel further comprises a third direction. The third direction and the first direction form a first angle, the third direction and the second direction form a second angle, the first angle and the second angle are acute angles, and the common electrode layer covers the light-emitting chips and is disposed between the adjacent light-emitting chips. A width of the third horizontal portion of the common electrode layer in the first direction is equal to a width of the third horizontal portion of the common electrode layer in the third direction.

Optionally, a plurality of the light-emitting chips are arranged in an array in a first direction and a second direction. The common electrode layer covers the light-emitting chips and is disposed between the adjacent light-emitting chips. The second horizontal portion comprises a first sub-portion extends along the first direction and a second sub-portion extends along a third direction, where the third direction and the first direction form a first angle, the third direction and the second direction form a second angle, the first angle and the second angle are acute angles. A difference between a width of the second sub-portion and a width of the first sub-portion is equal to a difference between a distance between the adjacent protrusion portions in the third direction and a distance between the adjacent protrusion portions in the first direction.

The present disclosure provides a micro light-emitting diode display panel and a micro light-emitting diode display device. The micro light-emitting diode display panel comprises a substrate and a light-emitting layer. The light-emitting layer is disposed on a side of the substrate. The light-emitting layer comprises a light-emitting chip and a prism layer. The prism layer is disposed on a side of the light-emitting chip away from the substrate. The prism layer is provided with a void surrounding the light-emitting chip, and the void is arranged axially symmetrically with respect to a center line of the light-emitting chip. In the present disclosure, a void surrounding a light-emitting chip is provided in a prism layer, so that the void is arranged axially symmetrically with respect to a center line of the light-emitting chip. Therefore, a distance between the light-emitting chip and the void in a transverse direction is equal to a distance between the light-emitting chip and the void in an oblique direction. And, an angle at which a light ray emitted from the light-emitting chip is reflected at a contact surface between the prism layer and the void in the transverse direction is same as an angle at which a light ray emitted from the light-emitting chip is reflected at the contact surface between the prism layer and the void in the oblique direction. Accordingly, a plane formed by the light-emitting chip and the contact surface between and the prism layer and the void is same as a tangential focal plane or a sagittal focal plane, which solves a problem of third-order aberration, and thus prevents astigmatism. Furthermore, light crosstalk between adjacent sub-pixels is avoided by reflecting the light rays, thereby improving display effect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF THE EMBODIMENTS

Figure 1:
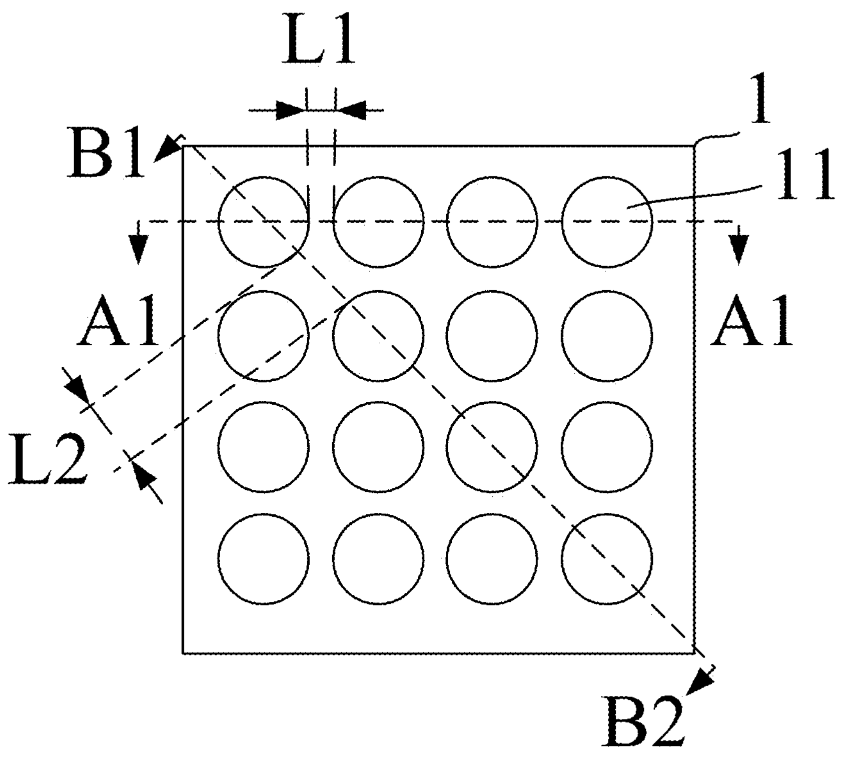
FIG. 1 (Related art)
FIG. 1 is a schematic diagram of a current silicon-based micro light-emitting diode display device.

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

In the disclosure, it is should be understood that spatially relative terms, such as “center”, “longitudinal”, “lateral”, “length”, “width”, “above”, “below”, “front”, “back”, “left”, “right”, “horizontal”, “vertical”, “top”, “bottom”, “inner”, “outer”, “clockwise”, “counterclockwise”, “axial”, “radial”, “circumferential”, and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures. In addition, the term “first”, “second” are for illustrative purposes only and are not to be construed as indicating or imposing a relative importance or implicitly indicating the number of technical features indicated. Thus, a feature that limited by “first”, “second” may expressly or implicitly include at least one of the features. In the description of the present disclosure, the meaning of “plural” is two or more, unless otherwise specifically defined.

All of the terminologies containing one or more technical or scientific terminologies have the same meanings that persons skilled in the art understand ordinarily unless they are not defined otherwise. For example, “arrange,” “couple,” and “connect,” should be understood generally in the embodiments of the present disclosure. For example, “firmly connect,” “detachably connect,” and “integrally connect” are all possible. It is also possible that “mechanically connect,” “electrically connect,” and “mutually communicate” are used. It is also possible that “directly couple,” “indirectly couple via a medium,” and “two components mutually interact” are used.

In the description of this specification, the description of the terms “one embodiment”, “some embodiments”, “examples”, “specific examples”, or “some examples”, and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

In the present disclosure, unless definite regulation and limitation, a first feature “above” or “under” a second feature may include direct contact of the first and second features. A first feature “above” or “under” a second feature may also include first feature contacting the second feature via other features between the first and second features rather than contact directly. Moreover, the first feature “above,” “over,” or “on” the second feature means that the first feature is over or above the second feature or that the level of the first feature is merely higher than the level of the second feature. The first feature "below," "under," or "beneath" the second feature means that the first feature is under or below the second feature or that the level of the first feature is merely lower than the level of the second feature.

The following disclosure provides many different embodiments or examples to implement different structures of the present disclosure. In order to simplify the disclosure of the present disclosure, the components and settings of specific examples are described below. They are for example purposes only and are not intended to limit this application. Further, the present disclosure may repeat reference numbers and/or reference letters in different examples, such duplication is for the purpose of simplification and clarity, and does not by itself indicate the relationship between the various embodiments and/or settings discussed. Further, the present disclosure provides various examples of specific processes and materials, but those of ordinary skill in the art may be aware of the application of other processes and/or the use of other materials. The following are described in detail, it should be noted that the order of description of the following embodiments is not used as a qualification for the preferred order of embodiments.

Figure 2:
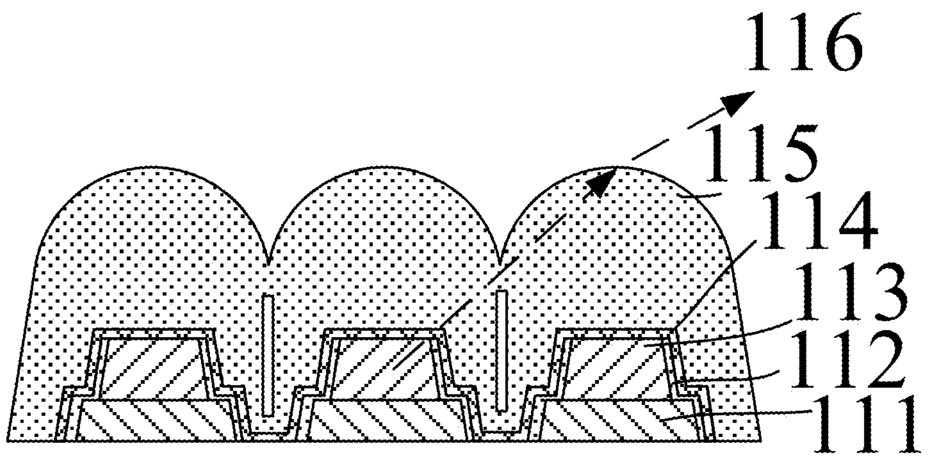
FIG. 2 (Related art)
FIG. 2 is a cross-sectional view of the current silicon-based micro light-emitting diode display device of FIG. 1 along a line A1-A2.
Figure 3:
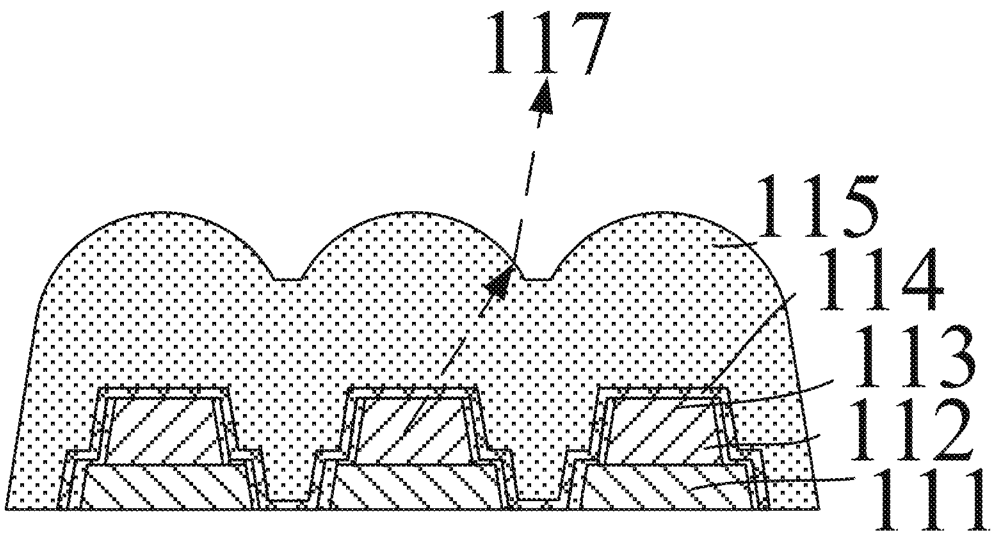
FIG. 3 (Related art)
FIG. 3 is a cross-sectional view of the current silicon-based micro light-emitting diode display device of FIG. 1 along a line B1-B2.

FIG. 1 is a schematic diagram of a current silicon-based micro light-emitting diode display device. FIG. 2 is a cross-sectional view of the current silicon-based micro light-emitting diode display device of FIG. 1 along a line A1-A2. FIG. 3 is a cross-sectional view of the current silicon-based micro light-emitting diode display device of FIG. 1 along a line B1-B2.

As illustrated in FIG. 1-FIG. 3, the current silicon-based micro light-emitting diode display device 1 comprises a plurality of subpixels 11. Each of the subpixels 11 comprises a first electrode 111, a light-emitting diode 112, an insulating layer 113, a second electrode 114, and a prism 115. A spacing L1 of the subpixels 11 arranged transversely is different from a spacing of the subpixels 11 arranged obliquely, so that a shape of the prism 115 in a transverse direction is different from a shape of the prism 115 in an oblique direction (as shown in FIG. 2 and FIG. 3, the shape in the transverse direction is an angle, and the shape in the oblique direction is a transverse line). When light irradiates the prism 115, light rays from different directions are asymmetrically incident on the prism 115, so that an inclined plane formed by the light-emitting diode 112 and the prism 115 is different from a tangential focal plane and a sagittal focal plane, resulting in third-order aberration. Therefore, astigmatism occurs during display and affects display effect, and crosstalk of transverse lights between the adjacent subpixels 11 causes chromatic aberration, thereby affecting the display effect. Specifically, as shown in FIG. 2 and FIG. 3, when a first light ray 116 and a second light ray 117 emitted from the light-emitting diode 112 with a same emission angle irradiate on the prism 115 in the transverse direction and the oblique direction, respectively, the first light ray 116 and the second light ray 117 form different angles with the prism 115, so that exit angles of the first light ray 116 and the second light ray 117 exited from the prism 115 are different, resulting in astigmatism. Accordingly, the current silicon-based micro light-emitting diode display device has a technical problem of poor display effect due to astigmatism caused by different shapes of prisms in different directions.

Figure 4:
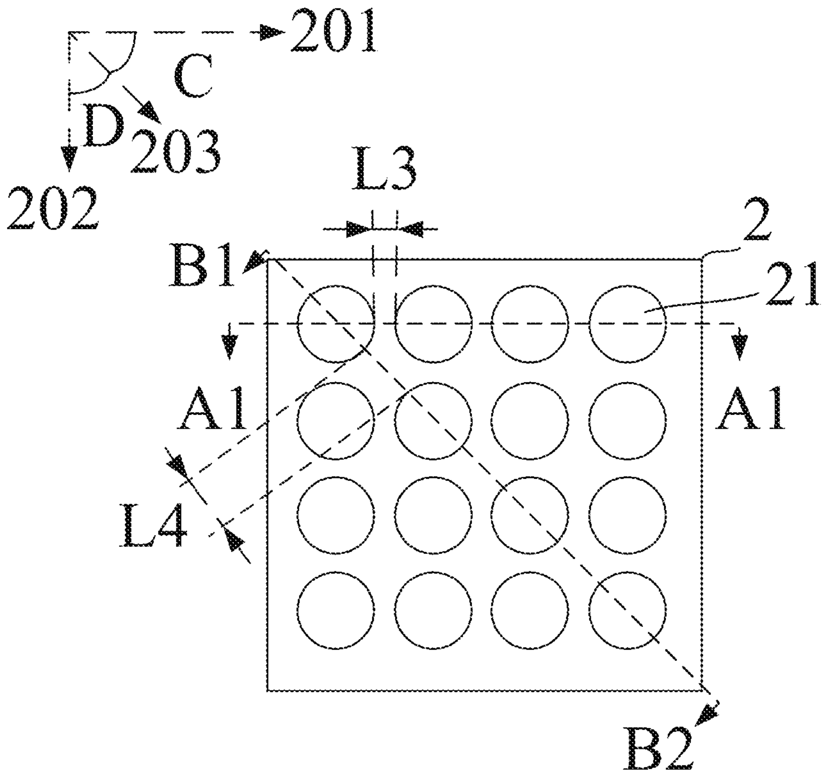
FIG. 4 is a schematic diagram of a micro light-emitting diode display panel according to an embodiment of the present disclosure.
Figure 5:
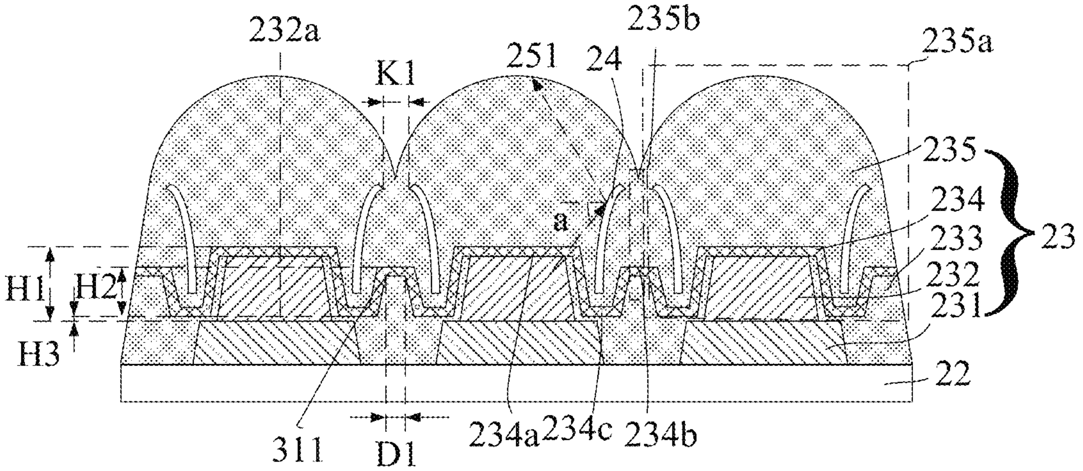
FIG. 5 is a first cross-sectional view of the micro light-emitting diode display panel of FIG. 4 along a line A1-A2.
Figure 6:
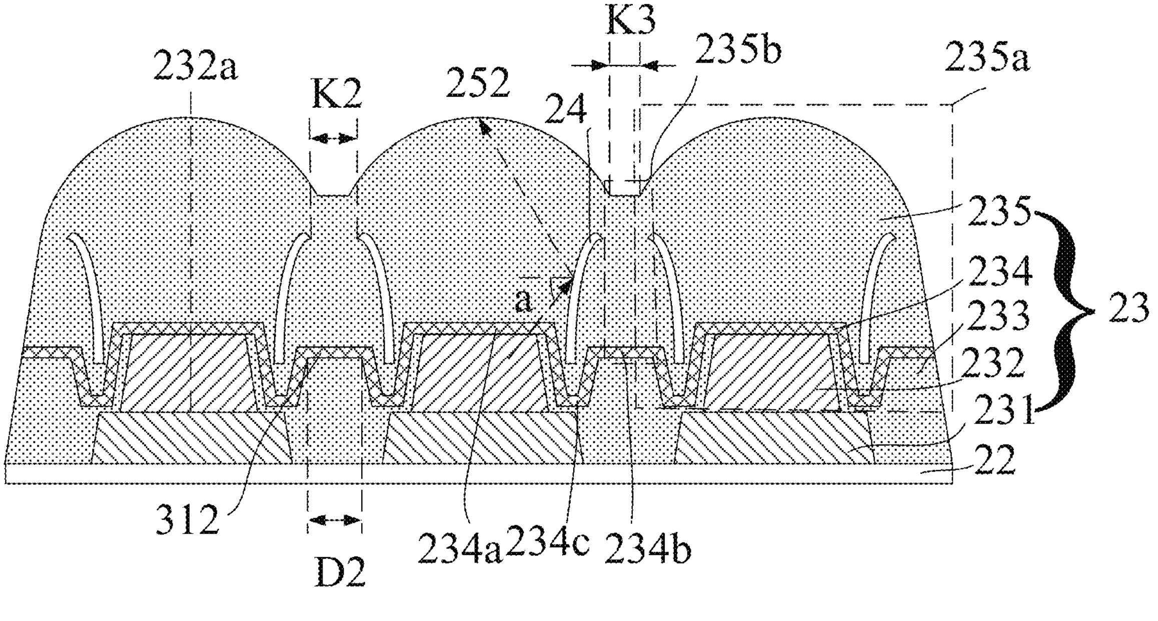
FIG. 6 is a first cross-sectional view of the micro light-emitting diode display panel of FIG. 4 along a line B1-B2.
Figure 7:
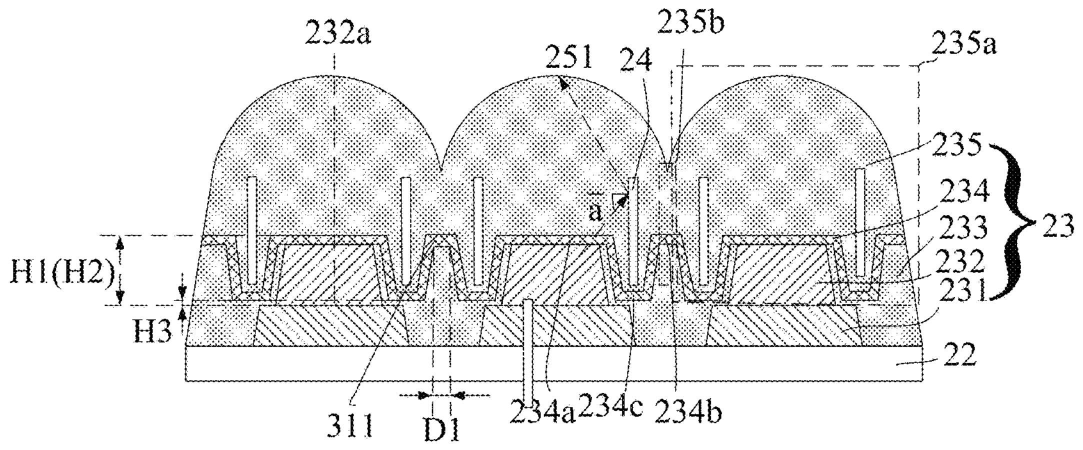
FIG. 7 is a second cross-sectional view of the micro light-emitting diode display panel of FIG. 4 along the line A1-A2.
Figure 8:
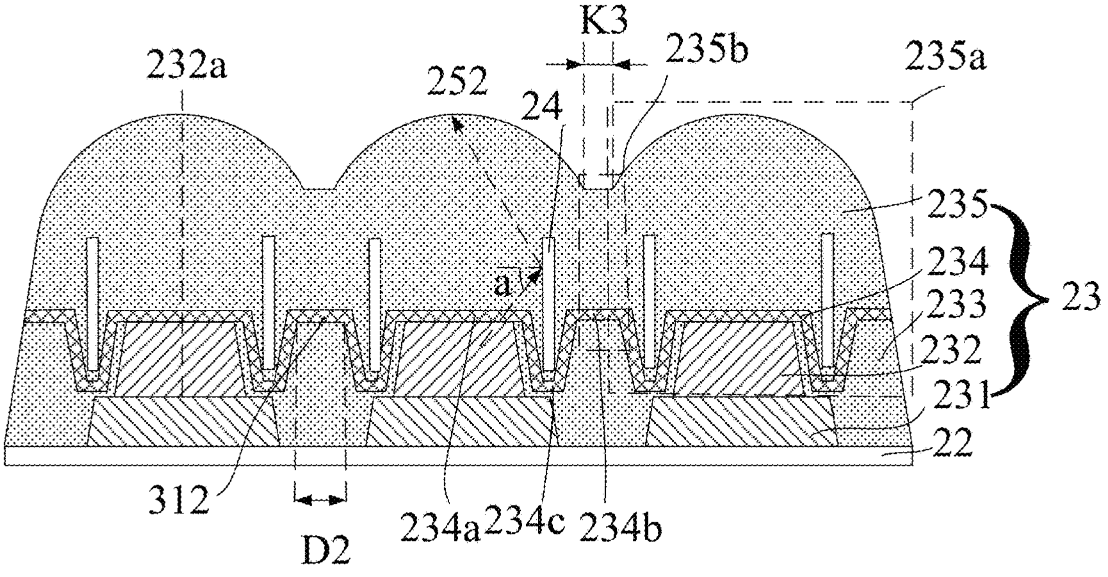
FIG. 8 is a second cross-sectional view of the micro light-emitting diode display panel of FIG. 4 along the line B1-B2.
Figure 9:
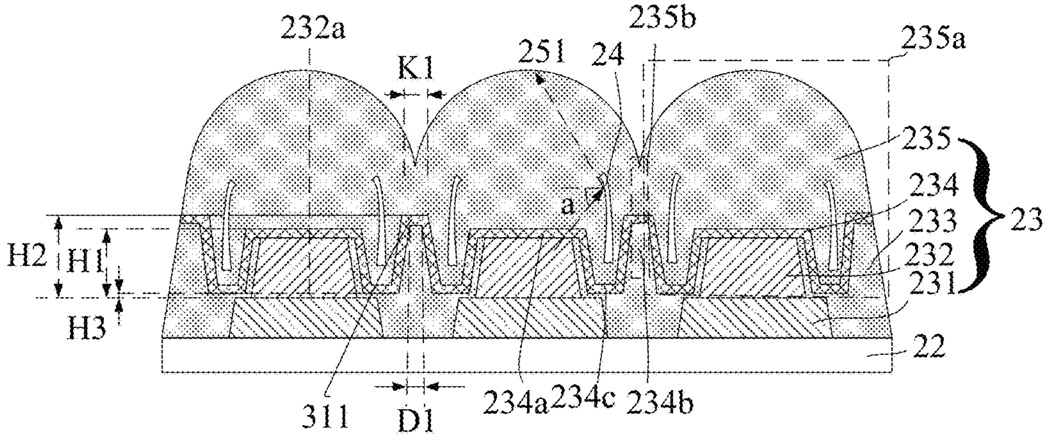
FIG. 9 is a third cross-sectional view of the micro light-emitting diode display panel of FIG. 4 along the line A1-A2.
Figure 10:
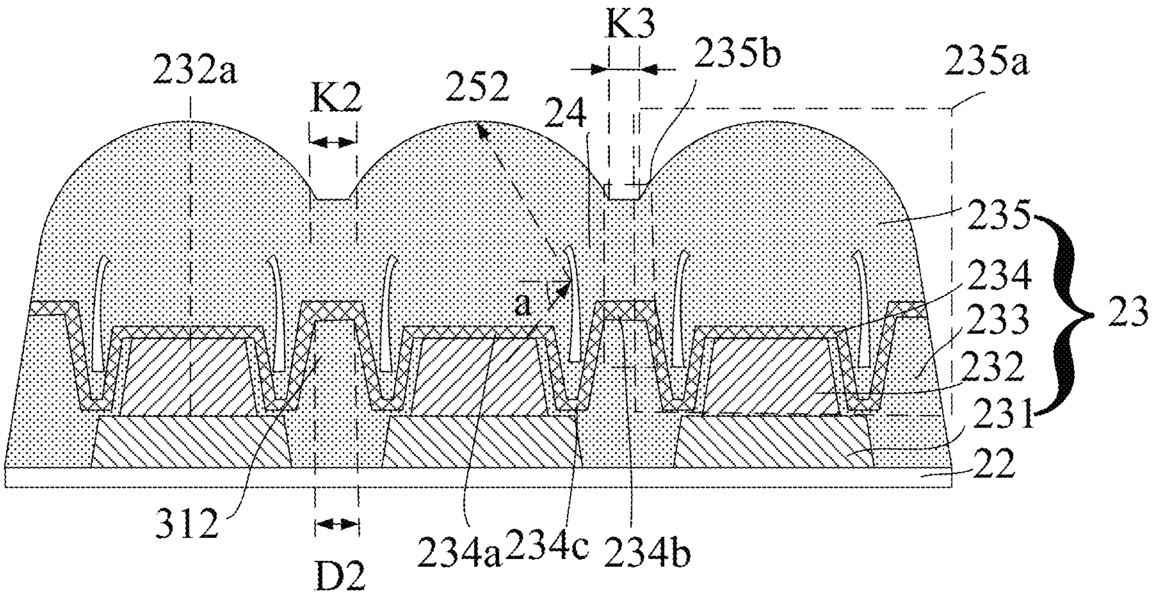
FIG. 10 is a third cross-sectional view of the micro light-emitting diode display panel of FIG. 4 along the line B1-B2.
Figure 11:
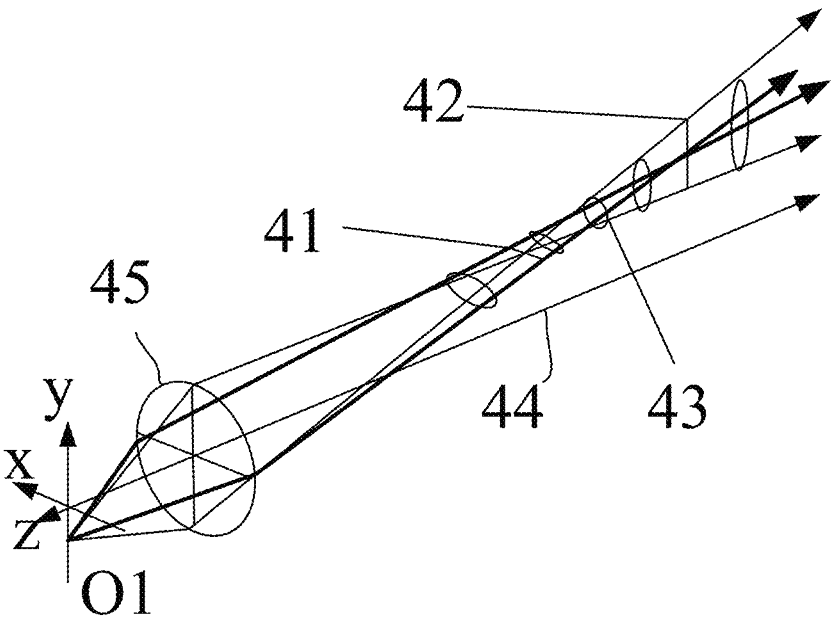
FIG. 11 (Related art)
FIG. 11 is an imaging principle diagram of the current silicon-based micro light-emitting diode display device.
Figure 12:
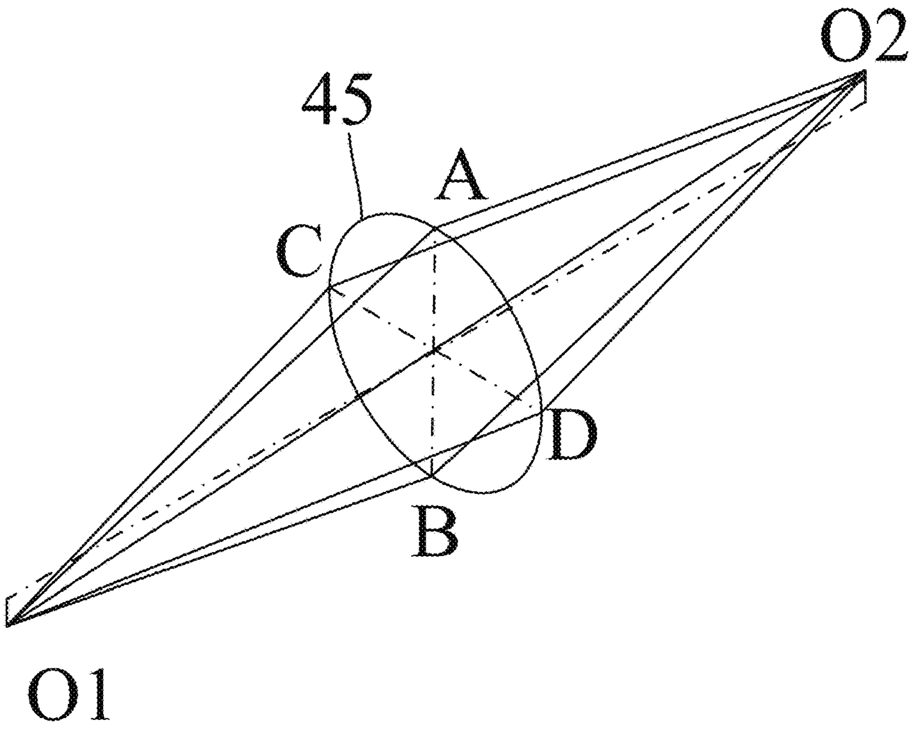
FIG. 12 is an imaging principle diagram of the micro light-emitting diode display panel according to an embodiment of the present disclosure.
Figure 13:
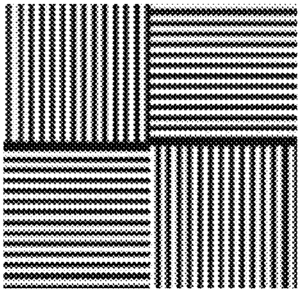
FIG. 13 is a schematic diagram of display effect of the micro light-emitting diode display panel according to an embodiment of the present disclosure.
Figure 14:
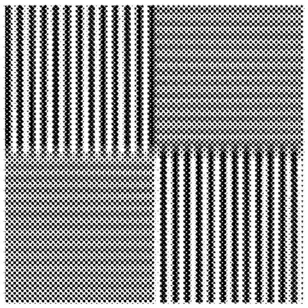
FIG. 14 (Related art)
FIG. 14 is a schematic diagram of display effect of the current silicon-based micro light-emitting diode display device.

FIG. 4 is a schematic diagram of a micro light-emitting diode display panel according to an embodiment of the present disclosure. FIG. 5 is a first cross-sectional view of the micro light-emitting diode display panel of FIG. 4 along a line A1-A2. FIG. 6 is a first cross-sectional view of the micro light-emitting diode display panel of FIG. 4 along a line B1-B2. FIG. 7 is a second cross-sectional view of the micro light-emitting diode display panel of FIG. 4 along the line A1-A2. FIG. 8 is a second cross-sectional view of the micro light-emitting diode display panel of FIG. 4 along the line B1-B2. FIG. 9 is a third cross-sectional view of the micro light-emitting diode display panel of FIG. 4 along the line A1-A2. FIG. 10 is a third cross-sectional view of the micro light-emitting diode display panel of FIG. 4 along the line B1-B2. FIG. 11 is an imaging principle diagram of the current silicon-based micro light-emitting diode display device. FIG. 12 is an imaging principle diagram of the micro light-emitting diode display panel according to an embodiment of the present disclosure. FIG. 13 is a schematic diagram of display effect of the micro light-emitting diode display panel according to an embodiment of the present disclosure. FIG. 14 is a schematic diagram of display effect of the current silicon-based micro light-emitting diode display device. FIG. 15 is a first structural schematic diagram of the micro light-emitting diode display panel corresponding to each step of a method for manufacturing the micro light emitting diode display panel according to an embodiment of the present disclosure. FIG. 16 is a second structural schematic diagram of the micro light-emitting diode display panel corresponding to each step of a method for manufacturing the micro light emitting diode display panel according to an embodiment of the present disclosure.

Embodiments of the present disclosure are directed to a micro light emitting diode display panel and a micro light emitting diode display device to alleviate the above technical problems.

An embodiment of the present disclosure provides a micro light-emitting diode display panel 2, as shown in FIG. 4 to FIG. 6. The micro light-emitting diode display panel 2 comprises a substrate 22 and a light-emitting layer 23.

The light-emitting layer 23 is disposed on a side of the substrate 22. The light-emitting layer 23 comprises a light-emitting chip 232 and a prism layer 235. The prism layer 235 is disposed on a side of the light-emitting chip 232 away from the substrate 22.

The prism layer 235 is provided with a void 24 surrounding the light-emitting chip 232, and the void 24 is arranged axially symmetrically with respect to a center line 232*a* of the light-emitting chip 232.

In the micro light-emitting diode display panel 2 according to an embodiment of the present disclosure, the void 24 surrounding the light-emitting chip 232 is provided in the prism layer 235, and the void 24 is arranged axially symmetrically with respect to the center line 232*a* of the light-emitting chip 232, so that a distance between the light-emitting chip 232 and the void 24 in the transverse direction is equal to a distance between the light-emitting chip 232 and the void 24 in the oblique direction, and an angle at which a light ray irradiated from the light-emitting chip 232 to a contact surface between the prism layer 235 and the void 24 is reflected in the transverse direction is equal to an angle at which a light ray irradiated from the light-emitting chip 232 to a contact surface between the prism layer 235 and the void 24 is reflected in the oblique direction. Therefore, a plane formed by the light-emitting chip 232 and the contact surface between the prism layer 235 and the void 24 is same as a tangential focal plane or a sagittal focal plane, thereby solving a problem of third-order aberration, and thus preventing astigmatism. Furthermore, light crosstalk between adjacent sub-pixels is avoided by reflecting the light rays, thereby improving display effect.

Specifically, since the prism layer 235 is provided with the void 24 surrounding the light-emitting chip 232, the distance between the light-emitting chip 232 and the void 24 in the transverse direction is equal to the distance between the light-emitting chip 232 and the void 24 in the oblique direction, and the void 24 is symmetrical with respect to the center line 232*a* of the light-emitting chip 232. Therefore, an angle at which a light ray emitted by the light-emitting chip 232 and irradiated to an interface between the prism layer 235 and the void 24 is reflected in the transverse direction is equal to an angle at which a light ray emitted by the light-emitting chip 232 and irradiated to the interface between the prism layer 235 and the void 24 is reflected in the oblique direction.

That is, light rays can be symmetrically irradiated to the interface between the prism layer 235 and the void 24, so that astigmatism will not occur when the light rays exit, thereby improving the display effect. Furthermore, since the light rays are reflected by the interface between the prism layer 235 and the void 24, crosstalk of light rays emitted by the adjacent light-emitting chips 232 can be prevented, and chromatic aberration can be prevented, thereby further improving the display effect.

The void 24 is provided with air. A refractive index of the prism layer 235 is different from a refractive index of the air, so that when the light rays are irradiated to the contact surface of the prism layer 235 and the void 24, they can be totally reflected, thereby adjusting angles of the light rays emitted by the light-emitting layer 23 and making the light rays emitted by the light-emitting layer 23 symmetrical, and thus modifying a light pattern, solving problems of dispersion and light crosstalk, and improving the display effect.

In some embodiments, as shown in FIG. 5 and FIG. 6, the light-emitting layer 23 further comprises a common electrode layer 234. The common electrode layer 234 is disposed between the light-emitting chip 232 and the prism layer 235.

The prism layer 235 comprises a plurality of protrusion portions 235*a* and a plurality of connecting portions 235*b*. Each of the connecting portions 235*b* is located between the adjacent protrusion portions 235*a*. A distance between the connecting portions 235*b* and the substrate 22 is less than a distance between the protrusion portions 235*a* and the substrate 22.

The common electrode layer 234 comprises a first horizontal portion 234*a* corresponding to the protrusion portion 235*a*, a second horizontal portion 234*b* corresponding to the connecting portion 235*b*, and a third horizontal portion 234*c* located between the first horizontal portion 234*a* and the second horizontal portion 234*b*. In a direction from the substrate 22 to the light-emitting layer 23, a distance H1 between the first horizontal portion 234*a* and a bottom surface of the light-emitting chip 232 is greater than a distance H3 between the third horizontal portion 234*c* and the bottom surface of the light-emitting chip 232, a distance H2 between the second horizontal portion 234*b* and the bottom surface of the light-emitting chip 232 is greater than the distance H3 between the third horizontal portion 234*c* and the bottom surface of the light-emitting chip 232, and the second horizontal portion 234*b* is disposed on a side of the third horizontal portion 234*c* away from the substrate 22. Since the distance H1 between the first horizontal portion 234*a* and the bottom surface of the light-emitting chip 232 is greater than the distance H3 between the third horizontal portion 234*c* and the bottom surface of the light-emitting chip 232, the distance H2 between the second horizontal portion 234*b* and the bottom surface of the light-emitting chip 232 is greater than the distance H3 between the third horizontal portion 234*c* and the bottom surface of the light-emitting chip 232, and the second horizontal portion 234*b* is disposed on the side of the third horizontal portion 234*c* away from the substrate 22, the first horizontal portion 234*a*, the second horizontal portion 234*b*, and the third horizontal portion 234*c* form a groove. Therefore, when forming the prism layer 235, the void 24 may be formed. A light pattern of the light emitted by the light-emitting chip 232 is adjusted through the void 24 to improve its symmetry, thereby solving the problems of astigmatism and crosstalk, and thus improving the display effect.

Specifically, the connecting portions 235*b* and the protrusion portions 235*a* are defined for convenience in explaining a design of each structure. The prism layer 235 is disposed on an entire surface, and there is no obvious boundary between the portions. The connecting portion 235*b* refers to a portion between two protruding portions in the prism layer 235. Taking FIG. 5 as an example, there may be no connecting portion in FIG. 5, or a portion between the two protruding portions 235*a* may be defined as the connecting portion 235*b*.

Specifically, in the current display device, a portion of a common electrode layer between two adjacent light-emitting chips is located under the light-emitting chips, and a width of a gap of the light-emitting chips arranged in an oblique direction is larger, so that a depth-to-width ratio of the gap is smaller, and no void can be formed. Compared with this, in the embodiment of the present disclosure, the distance H1 between the first horizontal portion 234*a* and the bottom surface of the light-emitting chip 232 is greater than the distance H3 between the third horizontal portion 234*c* and the bottom surface of the light-emitting chip 232, the distance H2 between the second horizontal portion 234*b* and the bottom surface of the light-emitting chip 232 is greater than the distance H3 between the third horizontal portion 234*c* and the bottom surface of the light-emitting chip 232, and the second horizontal portion 234*b* is disposed on the side of the third horizontal portion 234*c* away from the substrate 22, so that the first horizontal portion 234*a*, the second horizontal portion 234*b*, and the third horizontal portion 234*c* form a groove with a larger depth-to-width ratio where the prism layer 235 can form the void 24. A light pattern of the light emitted by the light-emitting chip 232 is adjusted through the void 24 to improve its symmetry, thereby solving the problems of astigmatism and crosstalk, and thus improving the display effect.

In some embodiments, as illustrated in FIG. 5 and FIG. 6, in the direction from the substrate 22 to the light-emitting layer 23, the distance H1 between the first horizontal portion 234*a* and the bottom surface of the light-emitting chip 232 is greater than the distance H2 between the second horizontal portion 234*b* and the bottom surface of the light-emitting chip 232, the void 24 is arc-shaped, and the void 24 is concave from an area between the light-emitting chips 232 to the light-emitting chips 232. Since the distance H1 between the first horizontal portion 234*a* and the bottom surface of the light-emitting chip 232 is greater than the distance H2 between the second horizontal portion 234*b* and the bottom surface of the light-emitting chip 232, the void 24 is arc-shaped, and the void 24 is concave from the area between the light-emitting chips 232 to the light-emitting chips 232, when light rays irradiate an arc surface between the prism layer 235 and the void 24, they are reflected outside the prism layer 235, thereby making the light rays emitted by the light-emitting chips 232 symmetrical, solving the problems of astigmatism and crosstalk, and improving the display effect.

In some embodiments, as illustrated in FIG. 5 and FIG. 6, the void 24 is arranged at a junction of the protrusion portion 235*a* and the connecting portion 235*b*. The void 24 is bent from the protruding portion 235*a* toward the connecting portion 235*b*. Since the distance H1 between the first horizontal portion 234*a* and the bottom surface of the light-emitting chip 232 is greater than the distance H2 between the second horizontal portion 234*b* and the bottom surface of the light-emitting chip 232, when forming the prism layer 235, the prism layer 235 forms the void 24 at the groove formed by the first horizontal portion 234*a*, the second horizontal portion 234*b*, and the third horizontal portion 234*c*. The light rays are reflected by the interface between the void 24 and the prism layer 235, so that the light rays emitted by the light-emitting chip 232 are symmetrical, thereby solving the problems of astigmatism and crosstalk, and improving the display effect.

The void 24 is arranged between the first horizontal portion 234*a* and the second horizontal portion 234*b*.

Since the distance H1 between the first horizontal portion 234*a* and the bottom surface of the light-emitting chip 232 is greater than the distance H2 between the second horizontal portion 234*b* and the bottom surface of the light-emitting chip 232, when forming the prism layer 235, the prism layer 235 can form the void 24 that is concave from the area between the light-emitting chips 232 to the light-emitting chips 232. The light rays are reflected by the interface between the void 24 and the prism layer 235, so that the light rays emitted by the light-emitting chip 232 are symmetrical, thereby solving the problems of astigmatism and crosstalk, and improving the display effect.

In some embodiments, as shown in FIG. 7 and FIG. 8, in the direction from the substrate 22 to the light-emitting layer 23, the distance H1 between the first horizontal portion 234*a* and the bottom surface of the light-emitting chip 232 is equal to the distance H2 between the second horizontal portion 234*b* and the bottom surface of the light-emitting chip 232, and the void 24 is linear. Since the distance H1 between the first horizontal portion 234*a* and the bottom surface of the light-emitting chip 232 is equal to the distance H2 between the second horizontal portion 234*b* and the bottom surface of the light-emitting chip 232, and the void 24 is linear, when the light rays irradiate to the void 24, reflection angles of the light rays in the transverse direction and the diagonal direction are equal, so that the light rays emitted by the light-emitting chip 232 are symmetrical, thereby solving the problems of astigmatism and crosstalk, and improving the display effect.

Specifically, since the distance H1 between the first horizontal portion 234*a* and the bottom surface of the light-emitting chip 232 is equal to the distance H2 between the second horizontal portion 234*b* and the bottom surface of the light-emitting chip 232, when forming the prism layer 235, the prism layer 235 can form the linear void 24 extending in the direction from the prism layer 235 to the light-emitting chip 232. The light rays are reflected by the interface between the void 24 and the prism layer 235, so that the light rays emitted by the light-emitting chip 232 are symmetrical, thereby solving the problems of astigmatism and crosstalk, and improving the display effect.

In some embodiments, as shown in FIG. 9 and FIG. 10, in the direction from the substrate 22 to the light-emitting layer 23, the distance H1 between the first horizontal portion 234*a* and the bottom surface of the light-emitting chip 232 is less than the distance H2 between the second horizontal portion 234*b* and the bottom surface of the light-emitting chip 232, the void 24 is arc-shaped, and the void 24 is concave from the light-emitting chips 232 to the area between the light-emitting chips 232. Since the distance H1 between the first horizontal portion 234*a* and the bottom surface of the light-emitting chip 232 is less than the distance H2 between the second horizontal portion 234*b* and the bottom surface of the light-emitting chip 232, the void 24 is arc-shaped, and the void 24 is concave from the light-emitting chips 232 to the area between the light-emitting chips 232, when the light rays irradiate the arc surface between the prism layer 235 and the void 24, they are reflected outside the prism layer 235, thereby making the light rays emitted by the light-emitting chips 232 symmetrical, solving the problems of astigmatism and crosstalk, and improving the display effect.

Specifically, since the distance H1 between the first horizontal portion 234*a* and the bottom surface of the light-emitting chip 232 is less than the distance H2 between the second horizontal portion 234*b* and the bottom surface of the light-emitting chip 232, when forming the prism layer 235, the prism layer 235 can form the void 24 that is concave from the light-emitting chips 232 to the area between the light-emitting chips 232. The light rays are reflected by the interface between the void 24 and the prism layer 235, so that the light rays emitted by the light-emitting chip 232 are symmetrical, thereby solving the problems of astigmatism and crosstalk, and improving the display effect.

In some embodiments, the light-emitting layer 23 further comprises an independent electrode layer 231. The independent electrode layer 231 is disposed on a side of the light-emitting chip 232 away from the common electrode layer 234. In a single light-emitting subpixel 21, when the independent electrode 231, the light-emitting chip 232, and the common electrode layer 234 are stacked, there will be a problem of display astigmatism due to different shapes of the prisms in different directions. The embodiment of the present disclosure can solve the above technical problem by setting the voids.

In some embodiments, as illustrated in FIG. 4, FIG. 5, and FIG. 6, the light-emitting chips 232 are arranged in an array in a first direction 201 and a second direction 202. The micro light-emitting diode display panel 2 further comprises a third direction 203. The third direction 203 and the first direction 201 form a first angle C. The third direction 203 and the second direction 202 form a second angle D. The first angle C and the second angle D are acute angles. The common electrode layer 234 covers the light-emitting chips 232 and is disposed between the adjacent light-emitting chips 232.

A width of the third horizontal portion 234*c* of the common electrode layer 234 in the first direction 201 is equal to a width of the third horizontal portion 234*c* of the common electrode layer 234 in the third direction 203. By making the width of the third horizontal portion 234*a* of the common electrode layer 234 in the first direction 201 equal to the width of the third horizontal portion 234*a* of the common electrode layer 234 in the third direction 203, making a distance between the first horizontal portion 234*a* and the third horizontal portion 234*c* constant, and making a distance between the first horizontal portion 234*a* and the second horizontal portion 234*b* constant, a length, a width, a thickness, and an angle of the void 24 in the transverse direction are equal to a length, a width, a thickness, and an angle of the void 24 in the oblique direction, so that the light rays emitted by the light-emitting chip 232 are reflected by the interface between the void 24 and the prism layer 235 and then become symmetrical, thereby solving the problems of astigmatism and crosstalk, and thus improving the display effect.

It is noted that, in FIG. 4, the transverse direction is from left to right as an example, but the embodiment of the present disclosure is not limited thereto. The transverse direction may be from top to bottom, and an angle between the transverse direction and the oblique direction is not limited to an angle shown in FIG. 4, and may be 0 degrees to 90 degrees, excluding 0 degrees and 90 degrees.

In some embodiments, as illustrated in FIG. 4, FIG. 5, and FIG. 6, the light-emitting chips 232 are arranged in the array in the first direction 201 and the second direction 202. The micro light-emitting diode display panel 2 further comprises the third direction 203. The third direction 203 and the first direction 201 form the first angle C. The third direction 203 and the second direction 202 form the second angle D. The first angle C and the second angle D are acute angles. The common electrode layer 234 covers the light-emitting chips 232 and is disposed between the adjacent light-emitting chips 232. The second horizontal portion 234*b* comprises a first sub-portion 311 and a second sub-portion 312. The first sub-portion 311 extends along the first direction 201. The second sub-portion 312 extends along the third direction 203. A difference between a width D2 of the second sub-portion 312 and a width D1 of the first sub-portion 311 is equal to a difference between a distance K3 between adjacent protrusion portions 235*a* in the third direction 203 and a distance (shown as 0 in FIG. 5) between adjacent protrusion portions 235*a* in the first direction 201. By making the difference between the width of the second sub-section and the width of the first sub-section equal to a difference between a distance between adjacent prisms in the oblique direction and a distance between adjacent prisms in the transverse direction, in an area between adjacent light-emitting chips 232, a difference between a distance K2 between adjacent voids 24 in the oblique direction and a distance K1 between adjacent voids 24 in the transverse direction is equal to a difference K3 between the distance between adjacent protrusion portions 235*a* in the oblique direction and the distance between adjacent protrusion portions 235*a* in the transverse direction, so that the void 24 is symmetrical in all directions with respect to the center line 232*a* of the light-emitting chip 232, thereby making the light rays symmetrical, solving the problems of astigmatism and crosstalk, and improving the display effect.

Specifically, a distance between transversely arranged sub-pixels is still different from a distance between obliquely arranged sub-pixels, but the void 24 is symmetrical with respect to the light-emitting chip 232, so that a distance between the light-emitting chip 232 and the void 24 is equal in all directions, thereby improving symmetry of the light rays, solving the problems of astigmatism and crosstalk, and improving the display effect.

In some embodiments, as illustrated in FIG. 5 and FIG. 6, there is a distance between the void 24 and an upper surface of the prism layer 235, and there is a distance between the void 24 and an upper surface of the common electrode layer 234. By creating the distance between the void 24 and the upper surface of the prism layer 235, and the distance between the void 24 and the upper surface of the common electrode layer 234, water and oxygen are prevented from intruding into the light-emitting layer 23, thereby improving stability of the light-emitting layer 23, and thus increasing a yield rate of the micro light-emitting diode display panel 2.

Specifically, in a process of forming the void 24, the prism layer 235 is formed on the common electrode layer 234, the prism layer 235 fills the groove between the first horizontal portion 234*a* and the second horizontal portion 234*b* and forms the void 24. The prism layer 235 covers the void 24, so that the void 24 does not contact with the upper surface of the prism layer 235, and the void 24 does not contact with the upper surface of the common electrode layer 234, thereby preventing water and oxygen from intruding into the light-emitting layer 23, improving the stability of the light-emitting layer 23, and thus increasing the yield rate of the micro light-emitting diode display panel 2.

In some embodiments, the refractive index of the prism layer 235 is 1.4 to 2.5, so that the reflection angles of the light rays can be adjusted, and the light rays are emitted from the corresponding light-emitting chip 232 to prevent light crosstalk.

Angles of the light rays between the prism layer 235 and the void 24 are 23 degrees to 45 degrees.

The substrate 22 comprises a silicon-based complementary metal oxide semiconductor (CMOS). The silicon-based CMOS reduces power consumption of the display panel.

As shown in FIG. 5, the light-emitting layer 23 further comprises an interlayer insulation layer 233.

In the above embodiments, the micro light-emitting diode display panel 2 is described from various structures. It can be understood that when there is no conflict between the embodiments, the embodiments can be combined to achieve better technical effects. For example, there is a distance between the void 24 and the upper surface of the prism layer 235, there is a distance between the void 24 and the upper surface of the common electrode layer 234, and the refractive index of the prism layer 235 is 1.4 to 2.5.

As shown in FIG. 11 and FIG. 12, in coordinate axes x, y, and z, a subpixel emits light rays from a point O1. Two pair of light rays converge at different points on a main ray axis 44, and finally form an optimal focusing position on two planes: a tangential focal plane 42 and a sagittal focal plane 41. Because the prism (shown as a lens 45 in FIG. 11 and FIG. 12) of the current silicon-based micro light-emitting diode display device has different shapes in various direction, the light rays form two separate and mutually perpendicular short lines after passing through the lens 45, and are combined on a theoretical plane to form an elliptical spot 43. That is, image points on the tangential focal plane 42 and the sagittal focal plane 41 do not overlap, resulting in different imaging at different axial positions, and thus resulting in dispersion. In the embodiment of the present disclosure, a void is provided so that a plane formed by light rays emitted from a point O1 and a lens 45 is a tangential focal plane O1AB or a sagittal focal plane O1CD, and thus a final image is O2, thereby preventing dispersion and improving the display effect.

FIG. 13 is a schematic diagram of display effect of the micro light-emitting diode display panel according to an embodiment of the present disclosure. FIG. 14 is a schematic diagram of display effect of the current silicon-based micro light-emitting diode display device. It can be seen that the embodiment of the present disclosure prevents dispersion and improves the display effect.

At the same time, the embodiment of the present disclosure provides a method for manufacturing a micro light emitting diode display panel. The method for manufacturing the micro light emitting diode display panel is used to prepare the micro light emitting diode display panel as described in any of the above embodiments.

In some embodiments, the method for manufacturing the micro light emitting diode display panel comprises the following steps.

Provide a substrate.

Figure 15A:
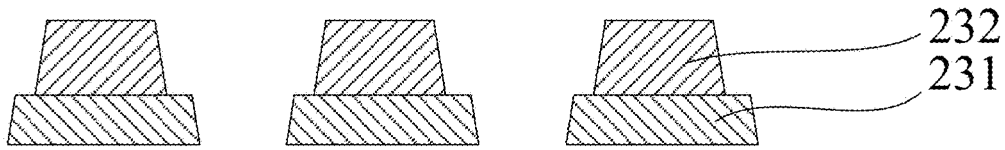
FIGS. 15A-15E are structural schematic diagrams of the micro light-emitting diode display panel corresponding to each step of a method for manufacturing the micro light emitting diode display panel according to an embodiment of the present disclosure.

An independent electrode layer 231 and a light-emitting chip 232 are formed on the substrate. A structure of the micro light-emitting diode display panel corresponding to this step is shown in FIG. 15A.

Figure 15B:
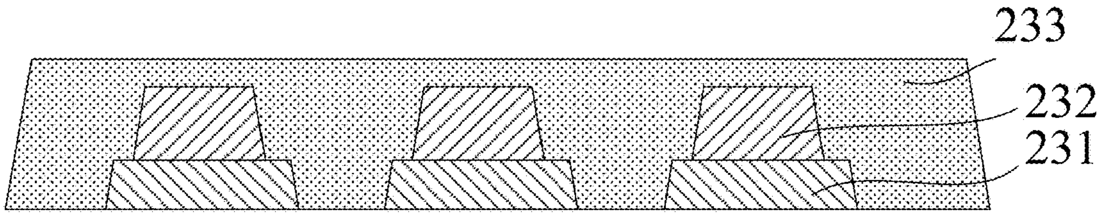

An insulating layer 233 is formed on the light-emitting chip 232. A structure of the micro light-emitting diode display panel corresponding to this step is shown in FIG. 15B.

Figure 15C:
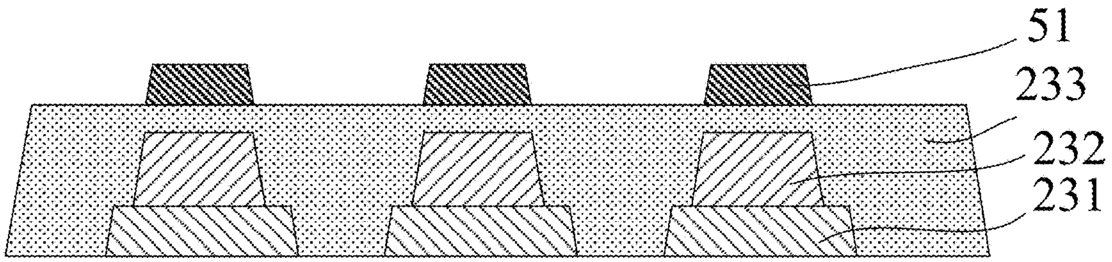

An inorganic layer 51 formed on the insulating layer 233, and patterning the inorganic layer 51. A structure of the micro light-emitting diode display panel corresponding to this step is shown in FIG. 15C.

Figure 15D:
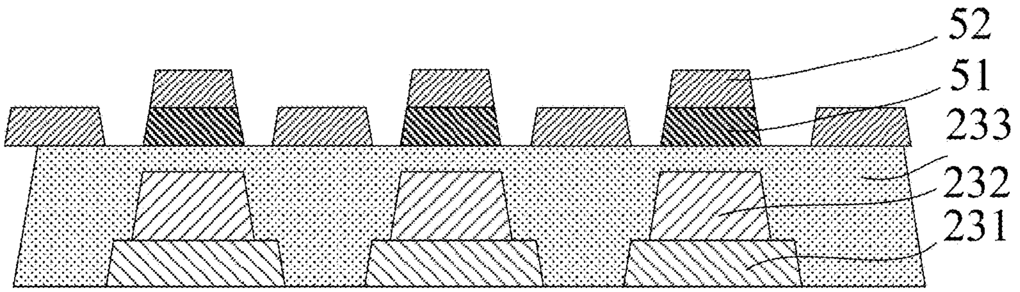

A photoresist layer 52 is formed on the inorganic layer 51 and an insulating layer 233, and patterning the photoresist layer 52. A structure of the micro light-emitting diode display panel corresponding to this step is shown in FIG. 15D.

Figure 15E:
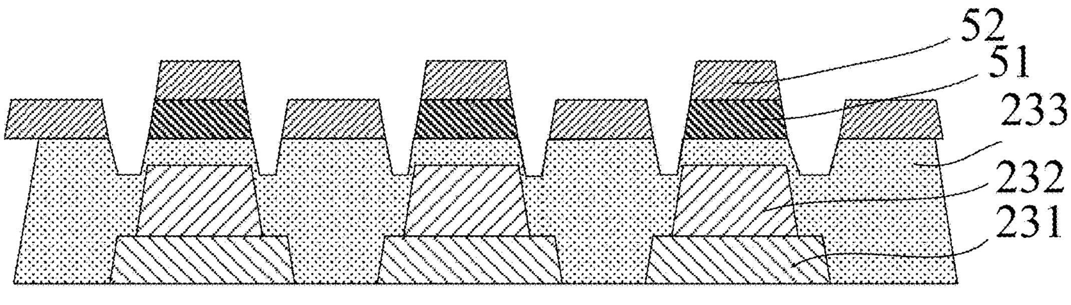

A first etching is performed on the insulating layer 233 to form a groove in an area not covered by the inorganic layer 51 and the photoresist layer 52. A structure of the micro light-emitting diode display panel corresponding to this step is shown in FIG. 15E.

Figure 16A:
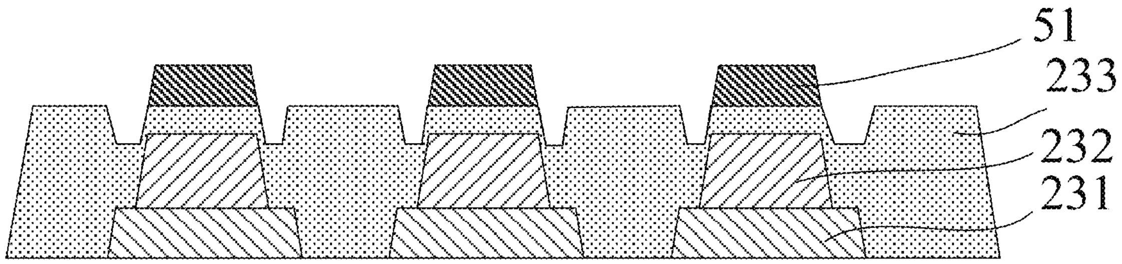
FIGS. 16A-16D are structural schematic diagrams of the micro light-emitting diode display panel corresponding to each step of a method for manufacturing the micro light emitting diode display panel according to an embodiment of the present disclosure.

The photoresist layer 52 is removed. A structure of the micro light-emitting diode display panel corresponding to this step is shown in FIG. 16A.

Figure 16B:
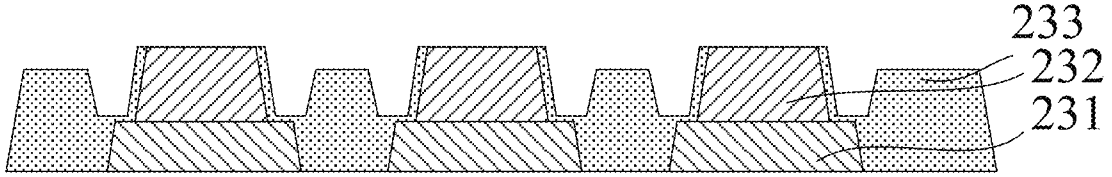

A second etching is performed on the insulating layer 233 to remove the inorganic layer 51 and make a height of a portion of the insulating layer 233 between adjacent light-emitting chips 232 is less than a height of the light-emitting chips, wherein a structure of the micro light-emitting diode display panel corresponding to this step is shown in FIG. 16B.

Figure 16C:
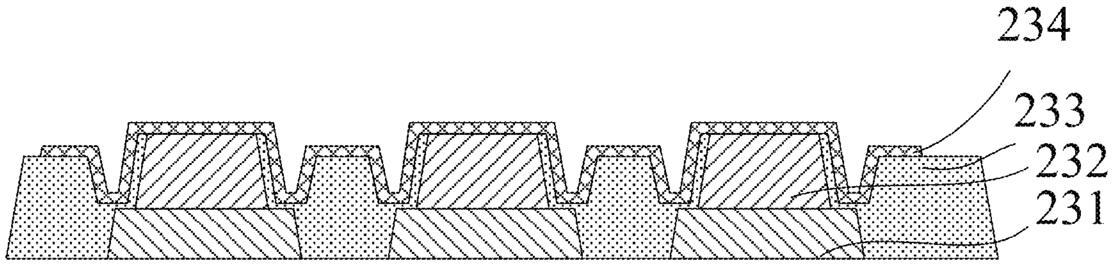

A common electrode layer 234 is formed on the insulating layer 233. A structure of the micro light-emitting diode display panel corresponding to this step is shown in FIG. 16C.

Figure 16D:
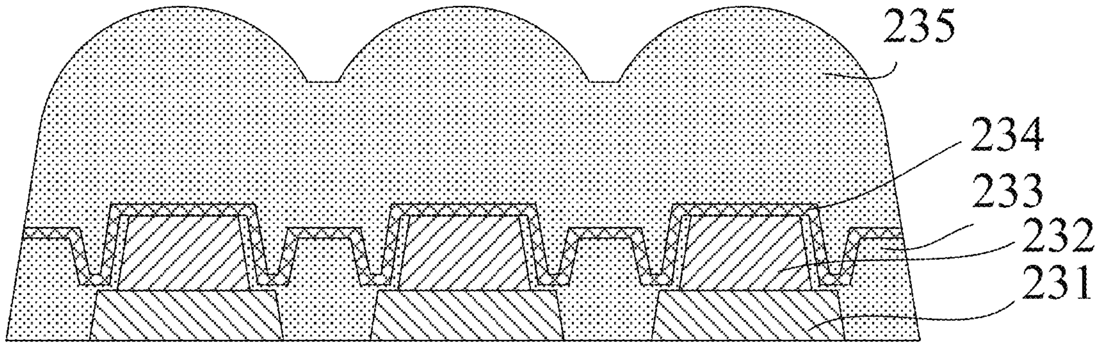

A prism layer 235 is formed on the common electrode layer 234. A structure of the micro light-emitting diode display panel corresponding to this step is shown in FIG. 16D.

The embodiment of the present disclosure provides a method for manufacturing a micro light emitting diode display panel. In the micro light emitting diode display panel made by the method for manufacturing the micro light emitting diode display panel, a void surrounding a light-emitting chip is provided in a prism layer, so that the void is arranged axially symmetrically with respect to a center line of the light-emitting chip. Therefore, a distance between the light-emitting chip and the void in a transverse direction is equal to a distance between the light-emitting chip and the void in an oblique direction. And, an angle at which a light ray emitted from the light-emitting chip is reflected at a contact surface between the prism layer and the void in the transverse direction is same as an angle at which a light ray emitted from the light-emitting chip is reflected at the contact surface between the prism layer and the void in the oblique direction. Accordingly, a plane formed by the light-emitting chip and the contact surface between and the prism layer and the void is same as a tangential focal plane or a sagittal focal plane, which solves a problem of third-order aberration, and thus prevents astigmatism. Furthermore, light crosstalk between adjacent sub-pixels is avoided by reflecting the light rays, thereby improving display effect.

At the same time, the embodiment of the present disclosure provides a micro light-emitting diode display device. The micro light-emitting diode display device comprises the micro light-emitting diode display panel as described in any of the above embodiments.

The present disclosure provides a micro light-emitting diode display panel and a micro light-emitting diode display device. The micro light-emitting diode display panel comprises a substrate and a light-emitting layer. The light-emitting layer is disposed on a side of the substrate. The light-emitting layer comprises a light-emitting chip and a prism layer. The prism layer is disposed on a side of the light-emitting chip away from the substrate. The prism layer is provided with a void surrounding the light-emitting chip, and the void is arranged axially symmetrically with respect to a center line of the light-emitting chip. In the present disclosure, a void surrounding a light-emitting chip is provided in a prism layer, so that the void is arranged axially symmetrically with respect to a center line of the light-emitting chip. Therefore, a distance between the light-emitting chip and the void in a transverse direction is equal to a distance between the light-emitting chip and the void in an oblique direction. And, an angle at which a light ray emitted from the light-emitting chip is reflected at a contact surface between the prism layer and the void in the transverse direction is same as an angle at which a light ray emitted from the light-emitting chip is reflected at the contact surface between the prism layer and the void in the oblique direction. Accordingly, a plane formed by the light-emitting chip and the contact surface between and the prism layer and the void is same as a tangential focal plane or a sagittal focal plane, which solves a problem of third-order aberration, and thus prevents astigmatism. Furthermore, light crosstalk between adjacent sub-pixels is avoided by reflecting the light rays, thereby improving display effect.

In the above embodiments, each embodiment is described with its own emphasis. For parts that are not described in detail in a certain embodiment, please refer to the relevant descriptions of other embodiments.

The micro light-emitting diode display panel and the micro light-emitting diode display device provided by the embodiments of the present disclosure are described in detail above. The present disclosure uses specific examples to describe principles and embodiments of the present disclosure. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A micro light-emitting diode display panel, comprising:

a substrate; and a light-emitting layer disposed on a side of the substrate and comprising a light-emitting chip and a prism layer disposed on a side of the light-emitting chip away from the substrate;

wherein the prism layer is provided with a void surrounding the light-emitting chip, and the void is arranged axially symmetrically with respect to a center line of the light-emitting chip;

wherein the light-emitting layer further comprises a common electrode layer, and the common electrode layer is disposed between the light-emitting chip and the prism layer;

wherein the prism layer comprises a plurality of protrusion portions and a plurality of connecting portions, each of the connecting portions is located between the adjacent protrusion portions, and a distance between the connecting portions and the substrate is less than a distance between the protrusion portions and the substrate; and wherein the common electrode layer comprises a first horizontal portion corresponding to the protrusion portion, a second horizontal portion corresponding to the connecting portion, and a third horizontal portion located between the first horizontal portion and the second horizontal portion;

in a direction from the substrate to the light-emitting layer, a distance between the first horizontal portion and a bottom surface of the light-emitting chip is greater than a distance between the third horizontal portion and the bottom surface of the light-emitting chip, a distance between the second horizontal portion and the bottom surface of the light-emitting chip is greater than the distance between the third horizontal portion and the bottom surface of the light-emitting chip, and the second horizontal portion is disposed on a side of the third horizontal portion away from the substrate.

2. The micro light-emitting diode display panel according to claim 1, wherein in the direction from the substrate to the light-emitting layer, the distance between the first horizontal portion and the bottom surface of the light-emitting chip is greater than the distance between the second horizontal portion and the bottom surface of the light-emitting chip, the void is arc-shaped, and the void is concave from an area between the light-emitting chips to the light-emitting chips.

3. The micro light-emitting diode display panel according to claim 2, wherein the void is arranged at a junction of the protrusion portion and the connecting portion, and the void is bent from the protruding portion toward the connecting portion.

4. The micro light-emitting diode display panel according to claim 1, wherein in the direction from the substrate to the light-emitting layer, the distance between the first horizontal portion and the bottom surface of the light-emitting chip is equal to the distance between the second horizontal portion and the bottom surface of the light-emitting chip, and the void is linear.

5. The micro light-emitting diode display panel according to claim 1, wherein in the direction from the substrate to the light-emitting layer, the distance between the first horizontal portion and the bottom surface of the light-emitting chip is less than the distance between the second horizontal portion and the bottom surface of the light-emitting chip, the void is arc-shaped, and the void is concave from the light-emitting chips to an area between the light-emitting chips.

6. The micro light-emitting diode display panel according to claim 1, wherein the light-emitting layer further comprises an independent electrode layer, and the independent electrode layer is disposed on a side of the light-emitting chip away from the common electrode layer.

7. The micro light-emitting diode display panel according to claim 2, wherein a plurality of the light-emitting chips are arranged in an array in a first direction and a second direction, and the common electrode layer covers the light-emitting chips and is disposed between the adjacent light-emitting chips; and wherein a width of the third horizontal portion of the common electrode layer in the first direction is equal to a width of the third horizontal portion of the common electrode layer in a third direction, where the third direction and the first direction form a first angle, the third direction and the second direction form a second angle, the first angle and the second angle are acute angles.

8. The micro light-emitting diode display panel according to claim 2, wherein a plurality of the light-emitting chips are arranged in an array in a first direction and a second direction, the common electrode layer covers the light-emitting chips and is disposed between the adjacent light-emitting chips, and the second horizontal portion comprises a first sub-portion extending along the first direction and a second sub-portion extending along a third direction, where the third direction and the first direction form a first angle, the third direction and the second direction form a second angle, the first angle and the second angle are acute angles, and wherein a difference between a width of the second sub-portion and a width of the first sub-portion is equal to a difference between a distance between the adjacent protrusion portions in the third direction and a distance between the adjacent protrusion portions in the first direction.

9. The micro light-emitting diode display panel according to claim 2, wherein there is a distance between the void and an upper surface of the prism layer, and there is a distance between the void and an upper surface of the common electrode layer.

10. The micro light-emitting diode display panel according to claim 1, wherein a refractive index of the prism layer ranges between 1.4 and 2.5.

11. A micro light-emitting diode display device, comprising a micro light-emitting diode display panel, the micro light-emitting diode display panel comprising:

a substrate; and a light-emitting layer disposed on a side of the substrate and comprising a light-emitting chip and a prism layer disposed on a side of the light-emitting chip away from the substrate;

wherein the prism layer is provided with a void surrounding the light-emitting chip, and the void is arranged axially symmetrically with respect to a center line of the light-emitting chip;

wherein the light-emitting layer further comprises a common electrode layer, and the common electrode layer is disposed between the light-emitting chip and the prism layer;

wherein the prism layer comprises a plurality of protrusion portions and a plurality of connecting portions, each of the connecting portions is located between the adjacent protrusion portions, and a distance between the connecting portions and the substrate is less than a distance between the protrusion portions and the substrate; and wherein the common electrode layer comprises a first horizontal portion corresponding to the protrusion portion, a second horizontal portion corresponding to the connecting portion, and a third horizontal portion located between the first horizontal portion and the second horizontal portion; in a direction from the substrate to the light-emitting layer, a distance between the first horizontal portion and a bottom surface of the light-emitting chip is greater than a distance between the third horizontal portion and the bottom surface of the light-emitting chip, a distance between the second horizontal portion and the bottom surface of the light-emitting chip is greater than the distance between the third horizontal portion and the bottom surface of the light-emitting chip, and the second horizontal portion is disposed on a side of the third horizontal portion away from the substrate.

12. The micro light-emitting diode display device according to claim 11, wherein in the direction from the substrate to the light-emitting layer, the distance between the first horizontal portion and the bottom surface of the light-emitting chip is greater than the distance between the second horizontal portion and the bottom surface of the light-emitting chip, the void is arc-shaped, and the void is concave from an area between the light-emitting chips to the light-emitting chips.

13. The micro light-emitting diode display device according to claim 12, wherein the void is arranged at a junction of the protrusion portion and the connecting portion, and the void is bent from the protruding portion toward the connecting portion.

14. The micro light-emitting diode display device according to claim 11, wherein in the direction from the substrate to the light-emitting layer, the distance between the first horizontal portion and the bottom surface of the light-emitting chip is equal to the distance between the second horizontal portion and the bottom surface of the light-emitting chip, and the void is linear.

15. The micro light-emitting diode display device according to claim 11, wherein in the direction from the substrate to the light-emitting layer, the distance between the first horizontal portion and the bottom surface of the light-emitting chip is less than the distance between the second horizontal portion and the bottom surface of the light-emitting chip, the void is arc-shaped, and the void is concave from the light-emitting chips to an area between the light-emitting chips.

16. The micro light-emitting diode display device according to claim 11, wherein the light-emitting layer further comprises an independent electrode layer, and the independent electrode layer is disposed on a side of the light-emitting chip away from the common electrode layer.

17. The micro light-emitting diode display device according to claim 12, wherein a plurality of the light-emitting chips are arranged in an array in a first direction and a second direction, and the common electrode layer covers the light-emitting chips and is disposed between the adjacent light-emitting chips; and wherein a width of the third horizontal portion of the common electrode layer in the first direction is equal to a width of the third horizontal portion of the common electrode layer in a third direction, where the third direction and the first direction form a first angle, the third direction and the second direction form a second angle, the first angle and the second angle are acute angles.

18. The micro light-emitting diode display device according to claim 12, wherein a plurality of the light-emitting chips are arranged in an array in a first direction and a second direction, the common electrode layer covers the light-emitting chips and is disposed between the adjacent light-emitting chips, and the second horizontal portion comprises a first sub-portion extending along the first direction and a second sub-portion extending along a third direction, where the third direction and the first direction form a first angle, the third direction and the second direction form a second angle, the first angle and the second angle are acute angles, and wherein a difference between a width of the second sub-portion and a width of the first sub-portion is equal to a difference between a distance between the adjacent protrusion portions in the third direction and a distance between the adjacent protrusion portions in the first direction.

* * * * *